United States Patent [19]

Wong

[11] Patent Number: 4,742,488

[45] Date of Patent: May 3, 1988

[54] SENSE AMPLIFIER/WRITE CIRCUIT FOR SEMICONDUCTOR MEMORIES

[75] Inventor: Thomas H. Wong, Sunnyvale, Calif.

[73] Assignee: Advanced Micro Devices, Inc., Sunnyvale, Calif.

[21] Appl. No.: 883,357

[22] Filed: Jul. 8, 1986

Related U.S. Application Data

[63] Continuation of Ser. No. 436,743, Oct. 25, 1982, abandoned.

[51] Int. Cl.[4] .............................................. G11C 7/00
[52] U.S. Cl. .................................... 365/189; 365/208; 365/179; 365/212
[58] Field of Search ............... 365/205, 206, 207, 208, 365/155, 179, 190, 211, 212, 189; 307/530, 455, 467

[56] References Cited

U.S. PATENT DOCUMENTS

| | | | |
|---|---|---|---|
| 3,622,799 | 11/1971 | Marley et al. | 307/455 |
| 4,099,070 | 7/1978 | Reinert | 365/155 |
| 4,272,811 | 6/1981 | Wong | 365/155 |
| 4,459,686 | 7/1984 | Toyoda | 365/155 |

Primary Examiner—Stuart N. Hecker
Assistant Examiner—Glenn A. Gossage
Attorney, Agent, or Firm—Patrick T. King; Warren S. Wolfeld; J. Vincent Tortolano

[57] ABSTRACT

An adjustable sense amplifier circuit for read/write control of solid state memory devices is described. In a write mode the circuit includes a write select path, coupled to a current source and coupled to a differential pair of data select transistors, wherein the input data state sets each of two differential pairs formed by the memory element cross-coupled latch, such that the memory element stores selected data. In a sense mode, a second current path is selected wherein an adjustable sense level is provided to each of two differential pairs formed by the memory element. The current source is coupled to a reference voltage source which is independent of the supply voltage. The reference voltage source tracks changes in temperature and also provides low beta compensation for current loss due to the low beta value of transistors in the write and sense paths.

6 Claims, 3 Drawing Sheets

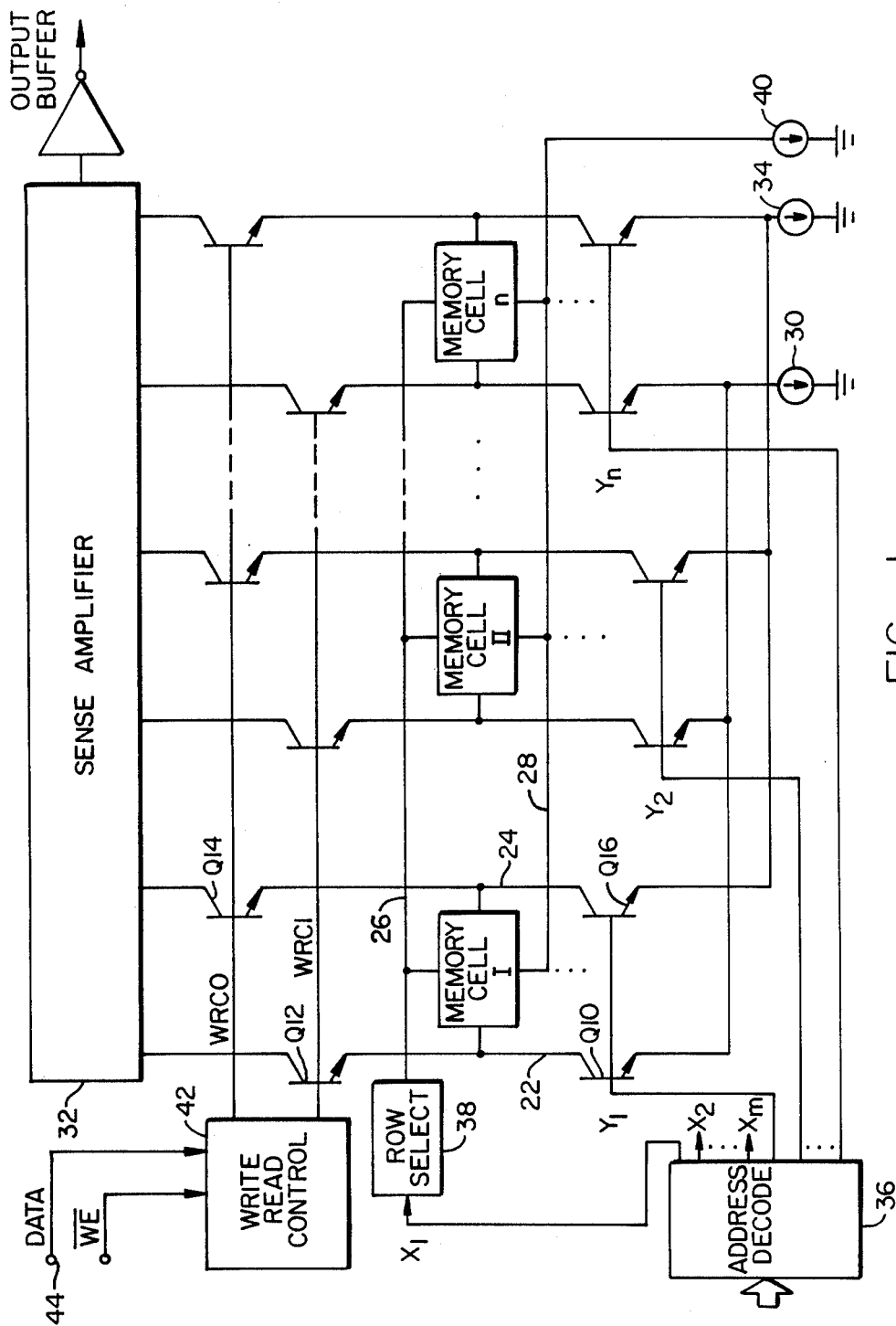
FIG._1.

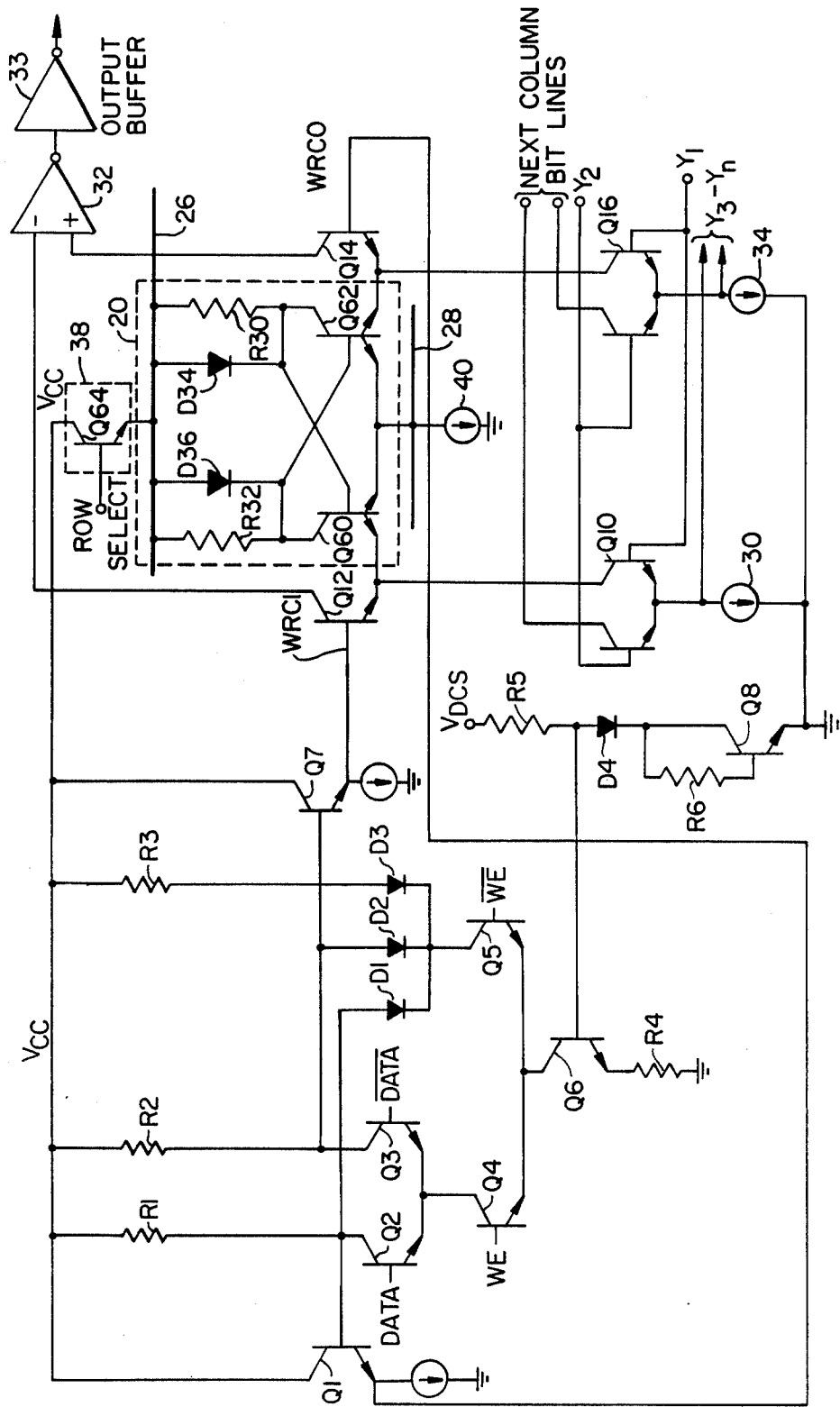
FIG._2.

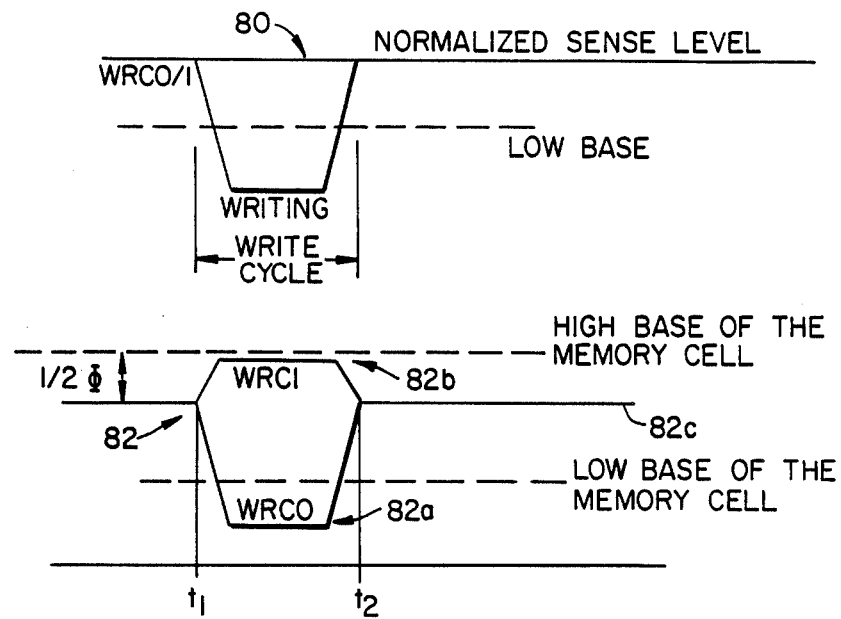
FIG._3.
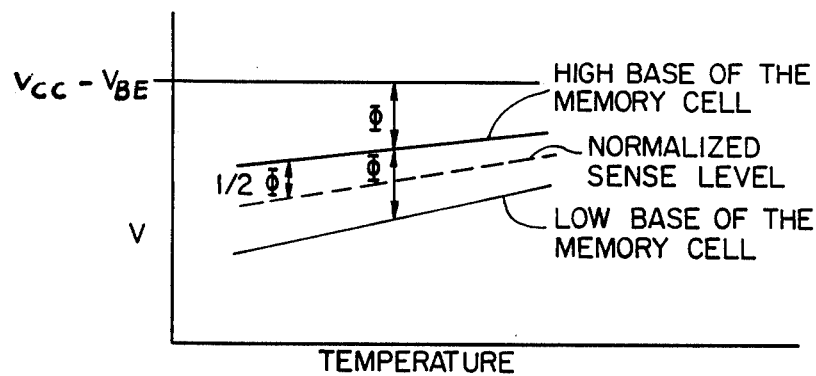
FIG._4.

SENSE AMPLIFIER/WRITE CIRCUIT FOR SEMICONDUCTOR MEMORIES

This is a continuation of Ser. No. 436,743, filed Oct. 25, 1982, now abandoned.

BACKGROUND OF THE INVENTION

1. Field of the Invention

The present invention relates to semiconductor memories. More particularly, the present invention relates to an adjustable sense amplifier circuit for read/write control of semiconductor memories.

2. Description of the Prior Art

Semiconductor devices are becoming increasingly sophisticated. One aspect of this sophistication is the need to integrate more and more circuitry onto smaller and smaller areas of silicon. Integrated circuit functions are comprised of linked circuit subfunctions. The subfunctions, in turn, are composed of individual circuit elements that are integrated onto a semiconductor substrate. The need to provide more and more functional groupings of components in less and less space makes the area available for circuitry on the semiconductor substrate more valuable. The elimination of unnecessary circuit elements from semiconductor integrated circuits creates space to add additional circuit subfunctions, and thereby increases the sophistication of the function performed by the integrated circuit. Additionally, the elimination of unnecessary circuit elements and their associated circuit pathways improves the speed and efficiency of the integrated circuit while lowering circuit power consumption and manufacturing cost.

A recent prior art read/write control circuit for a semiconductor memory is alluded to in a paper entitled "A Fast 7.5 ns Access 1K-Bit RAM for Cache-Memory Systems" which appeared at page 656 of the IEEE Journal of Solid-State Circuits, Vol. SC-13, No. 5, October, 1978. Additional prior art references are shown in an IEEE Press book entitled "Semiconductor Memories", at pages 37 and 45 Edited by David A. Hodges, and another book entitled "Semiconductor Memory Design and Application" at pages 97 et seq. by G. Luecke, et al., 1973, published by the McGraw-Hill Book Company.

A write and read control circuit for semiconductor memories is described in U.S. Pat. No. 4,272,811 issued to Wong on June 9, 1981, and assigned to the assignee of the present invention. The Wong patent discloses a circuit for controlling write and read functions in a semiconductor memory having a plurality of memory cells and of the type wherein the memory cell state is determined by a sense amplifier. Sense level in the Wong circuit depends on a plurality of diode and resistor voltage divider circuits.

SUMMARY OF THE INVENTION

It is an object of the present invention to reduce the number of circuit components in an integrated circuit design, thereby improving efficiency by increasing speed of circuit operation while reducing circuit power consumption.

It is a further object of the present invention to provide a sense amplifier circuit for effecting read/write control of a semiconductor memory device wherein sense level and write mode level may be adjusted as necessary during the formation of the circuit to compensate for noise and to adapt the circuit for operation in various applications.

The present invention typically has application in an array of semiconductor memory cells as a sense amplifier circuit for write and read control of said memory cells. As shown in FIG. 2, a constant current source is formed by a first transistor (Q6) having a resistor (R4) connected to its emitter. The current source transistor's base is coupled to a reference bias voltage such that a predetermined voltage is dropped across the resistor (R4).

The present invention operates in a sense mode ($\overline{WE}$), wherein a second transistor (Q5) supplies current from the transistor current source to provide a sense current level, as determined by associated series diode/resistor pairs (R1/D1, R2/D2, and R3/D3), to third and fourth transistors (Q1 and Q7), each of which biases half of a differential transistor pair associated with each memory cell at a selected sense level.

The present invention also operates in a write mode (WE) wherein the transistor current source supplies a current flow through a fifth transistor (Q4) and either a first data select path (R1/Q2) or a second data select path (R2/Q3), as determined by the state of data to be stored at the accessed memory cell. The current flow value is determined by path associated series diode/resistor pairs (R1/D1, R2/D2). If the first data state select path (R1/Q2) is selected, a logic high condition is written to one side of the memory cell. If the second data state select path (R2/Q3) is selected, a logic high condition is written to the other side of the memory cell.

The present invention provides a substantial reduction in circuit elements from those required in prior art devices while increasing circuit efficiency and speed of operation. Additional advantages of the present invention include the provision of a more stable current source to improve current reliability and the ability to readily select different circuit parameters such that optimum circuit performance is obtained in a wide range of circuit applications.

BRIEF DESCRIPTION OF THE DRAWINGS

These and other attendant advantages of the present invention will become apparent and readily appreciated as the same becomes better understood by reference to the following detailed description of the invention when considered in light of the drawings, wherein like reference numerals indicate like parts throughout the figures, and wherein:

FIG. 1 is a block schematic diagram of a memory array employing the circuit of the present invention;

FIG. 2 is a detailed schematic diagram of the circuit of the present invention as connected to at least one cell of the memory array;

FIG. 3 is a timing diagram which illustrates a write cycle of operation of the memory array; and FIG. 4 is a plot of voltage verses temperature characteristic of the circuit of the present invention.

DETAILED DESCRIPTION OF A PREFERRED EMBODIMENT

A plurality of asymmetrical memory cells are arranged in an array forming columns of bits and rows of words where each cell is disposed for storing and retrieving binary information. Each cell is comprised of a multivibrator circuit coupled to a pair of bit lines, which are used as a means for both writing information into and sensing information in the memory cells. Each pair of bit lines is coupled to memory cells and to the sense amplifier through a sense amplifier read/write control circuit.

Referring now to FIG. 1, a block schematic diagram is shown of a portion of memory cells I, II . . . n. The memory cell I is coupled between a pair of bit lines 22 and 24, and between a positive word line 26 and a negative word line 28. A row of memory cells are selected by word lines 26 and 28. A specific memory cell, such as memory cell I, is selected by activating bit lines 22 and 24.

Bit line 22 is coupled to a current source 30 through a transistor Q10. The opposite side of current source 30 is coupled to ground potential. Also, bit line 22 is coupled to a sense amplifier 32 through a transistor Q12. In a similar manner, bit line 24 is coupled to sense amplifier 32 through a transistor Q14, and is coupled to a current source 34 through a transistor Q16. The base terminals of transistors Q10 and Q16 are coupled to a $y_1$ output terminal of an address decode circuit 36. Hence, bit lines 22 and 24 are selected by the $y_1$ signal from the address decode 36 at the base terminals of Q10 and Q16. The positive word line 26 is coupled to a row select circuit 38 having an input designated $x_1$, which is coupled to another output terminal of the address decode circuit 36. The negative word line 28 is coupled to a current source 40. Accordingly, the row including memory cell I is selected by activating the row select circuit 38 with the $x_1$ output from the address decode 36.

The base terminals of the transistors Q12 and Q14 are coupled to a pair of output lines WRC1 and WRC0, respectively, from a read-write control circuit 42. Data is provided as an input to the read-write control circuit 42 on the DATA terminal 44. The operation of the circuit 42 in combination with a memory cell will be more readily understood following a description of the schematic diagram of FIG. 2, wherein the DATA input terminal 44 is coupled to the base terminal of a transistor Q2. Further, as shown in FIG. 2, the emitter terminal of the transistor Q2 is coupled to an emitter terminal of a transistor Q3 and to the collector terminal of a transistor Q4. Transistors Q2 and Q3 provide for differential data input. Thus, the base of transistor Q3 accepts a complementary, or $\overline{\text{DATA}}$ input.

The base of transistor Q4 is the write enable (WE) control point. The emitter of transistor Q4 is coupled to the emitter of transistor Q5 and additionally to the collector of transistor Q6.

Transistor Q6 is a current source having its emitter connected to resistor R4. The voltage drop across resistor R4 sets a reference level and, in the present embodiment of the invention, that voltage is equal to one diode voltage drop. The base of transistor Q6 is biased by a reference voltage as established by resistor R5, diode D4, resistor R6, and transistor Q8. An independent voltage $V_{DCS}$ is provided through resistor R5 to the anode of diode D4. The cathode of diode D4 is connected to resistor R6 and to the collector of transistor Q8. Resistor R6 is also connected to the base of transistor Q8 to provide low beta compensation.

A sense path is provided through transistor Q5. The base of transistor Q5 accepts the sense enable ($\overline{\text{WE}}$) input. The collector of transistor Q5 is connected to the cathodes of diodes D1, D2, and D3. The anode of diode D1 is connected to the base of transistor Q1, the collector of transistor Q2, and resistor R1; the anode of diode D2 is connected to the base of transistor Q7, the collector of transistor Q3, and resistor R2; and the anode of diode D3 is connected to resistor R3. Resistors R1, R2, and R3 are in turn connected to the voltage source line $V_{cc}$.

The collectors of transistors Q1 and Q7 are connected to the voltage source line $V_{cc}$. The emitter of transistor Q1 is connected to a current source and to the base of transistor Q14 at WRC0; the emitter of transistor Q7 is connected to a current source and to the base of transistor Q12 at WRC1.

The circuit portion enclosed within the dashed line 20 illustrates in greater detail a memory cell such as the memory cell I (FIG. 1). The emitter terminal of the transistor Q12 is coupled to a first emitter terminal of a transistor Q60 which is one of a pair of cross-coupled transistors. In a similar manner, the emitter terminal of the transistor Q14 is coupled to a first emitter terminal of the second cross-coupled transistor Q62. The second emitter terminals of the transistors Q60 and Q62 are connected together, and this connection is coupled to the negative word line 28. The base terminal of Q60 is coupled to the collector terminal of Q62, to the cathode of a diode D34, and to one side of a resistor R30. Similarly, the base terminal of Q62 is coupled to the collector terminal of Q60, to the cathode of a diode D36 and to one side of a resistor R32. The anodes of diodes D34 and D36, and the second side of resistors R30 and R32 are coupled together and this connection is coupled to the positive word line 26.

The row select circuit 38 is also illustrated in greater detail in FIG. 2, wherein the input terminal is coupled to the base terminal of a transistor Q64. The emitter terminal of the transistor Q64 is coupled to the positive word line 26, and the collector terminal thereof is coupled to the voltage supply $V_{cc}$. The collector terminals of the transistors Q12 and Q14 are coupled to the sense amplifier 32, and the output terminal of the sense amplifier is coupled to the input of an output buffer 33. The output of the buffer 33 constitutes the output of the memory array.

The read-write circuit 42 is in the sense mode of operation when transistor Q5 is turned ON ($\overline{\text{WE}}$) which couples current source Q6 to diodes D1, D2, and D3.

As mentioned above $V_{DCS}$ is an internal reference level that is independent of $V_{cc}$. The purpose of $V_{DCS}$ is to provide a voltage source to D4 and a beta voltage to Q8 that is of a known and fixed current density. Resistor R6 provides low beta compensation for current loss due to the low beta value in transistors Q4 or Q5 (as selected by WE or $\overline{\text{WE}}$) and Q2 or Q3 (as selected by DATA or $\overline{\text{DATA}}$).

The voltage across resistor R4 is equal to the voltage drop across diode D4 and described as:

$$V_{R4}=V_{D4}+V_{BEQ8}+(I_{BQ8}\times R6)-- \\ V_{BEQ6}\approx V_{D4}=V_{D4}=\Phi \quad (1)$$

where:
$V_{R4}$=Voltage across R4;
$V_{D4}$=Voltage across D4;
$V_{BEQ8}$=Base-Emitter Voltage of Q8;
$I_{BQ8}$=Base Current of Q8;
R6=Value of Resistor R6; and
$V_{BEQ6}$=Base-Emitter Voltage of Q6.

Note that the base-emitter voltage of all the transistors Q1–Q8 are substantially matched, since they are all fabricated on the same chip. Hence these voltages will sometimes be referred to hereinafter simply as $V_{BE}$.

In the read mode when WE is low and $\overline{WE}$ is high, WRC0 and WRC1 are set such that:

$$WRC0 = Vcc - V_{BE} - \phi/2; \quad (2)$$

$$WRC1 = Vcc - V_{BE} - \phi/2.$$

This value is obtained by setting:

$$R1 = R2 = R3 = (3/2)R4. \quad (3)$$

Since the current source formed by Q6 and R4 is equal to:

$$\Phi/R4,$$

the current is divided three equal ways by current paths through R1/D1, R2/D2, and R3/D3. Therefore, the voltage drop across R1 or R2 is:

$$\frac{1}{3} \times \frac{\phi}{R4} \times R1 = \quad (4)$$

$$\frac{1}{3} \times \frac{\phi}{R4} \times 3/2\, R4 =$$

$$\frac{\phi}{2}.$$

In the write mode when $\overline{WE}$ is low and WE is high, the current source formed by Q6/R4 is still equal to $\Phi/R4$. Therefore, the voltage drop across R1 or R2 is:

$$\frac{\phi}{R4} \times R1 = \quad (5)$$

$$\frac{\phi}{R4} \times 3/2\, R4 =$$

$$3\phi/2 =$$

$$1.5\,\phi$$

The current passes through transistor Q4 and either transistor Q2 and Q3, depending on the data input to the memory cell (DATA or $\overline{DATA}$). The current flow causes a voltage drop across either R1 or R2. The voltage drop at the emitter of Q1 or Q7 is:

$$Vcc - V_{BE}, \quad (6)$$

or $$Vcc - V_{BE} - 1.5\Phi. \quad (7)$$

Consequently, WRC0 and WRC1 are equal to the value determined by either formula (6) or (7) above.

Thus it can be seen that the values of resistors R1, R2 and R4 may be varied to determine the level required for write mode operation (WE) and that the value of resistor R3 may be varied to set the level required for sense mode operation ($\overline{WE}$). Additionally, it can be seen that varying R3 adjusts the value of the sense level inside the envelope of the high and low base of the memory cell instead of $(\frac{1}{2})\Phi$ as shown in FIG. 4, and by varying this value, allows for noise compensation. It is therefore a property of the present invention that improved noise immunity may be obtained while providing for adjustable write and sense levels as determined by the values selected for R1, R2, R3 and R4. Circuit operation then is a matter of selecting write mode (WE) by turning transistor Q4 ON or of selecting sense mode ($\overline{WE}$) by turning transistor Q5 ON.

In write mode, the state of data loaded into the memory cell is determined by selecting transistor Q2 (DATA) or transistor Q3 ($\overline{DATA}$). As a result of such selection, either transistor Q1 is turned ON, providing a WRC0 condition to bias Q14, or transistor Q7 is turned ON, providing a WRC1 condition to bias Q12.

To write a "zero" into the cell, the base of the transistor Q12 is pulled down to a level below that of the base of Q60 which causes Q60 to turn ON and Q12 to turn OFF. The cell thus changes to the "zero" state and Q14 is also turned ON. The current from the source 34 is routed through Q16 and Q14 to the sense amplifer 32, and the current from the source 30 is routed through Q10 and Q60 to word line 26.

With reference to FIG. 3, a timing diagram of the write operation is shown wherein waveform 80 illustrates a conventional memory cell write cycle. Waveform 82 illustrates a push-pull write cycle, wherein one side (e.g., WRC0 at level 82a) drops and the other side (e.g., WRC1 at level 82b) rises at the same time. This arrangement ensures that no bit line current can be steered into the "rise" side of the cell for a fast write operation. The level 82c is the normalized sense level, which is equal to the potential on the base terminals of Q12 and Q14 during a sense operation. A normalized sense level is a $V_{BE}$ shift below the sense level. In other words, the normalized sense level is equal to the sense level minus one $V_{BE}$.

FIG. 4 is a plot of the voltage for the memory cell, and the corresponding normalized sense level voltage with respect to temperature. The difference in the "high base" and the "low base" voltage levels is equal to one $V_{BE}$ or "$\Phi$", wherein high base is the base voltage level of an ON transistor and low base is the base voltage level of an OFF transistor within a memory cell. The sense level voltage is located between the high and low base voltage levels.

It will be appreciated that the selection of sense levels is a function of noise and circuit response time. Thus, if values for resistors R1, R2, R3 and R4 are chosen such that a lower sense level is achieved, there is a sacrifice in the circuit's noise immunity. If, instead, the resistor values provide a higher sense level, then there is a sacrifice in the speed of circuit operation. It should also be noted that the values of resistors R1, R2, and R3 were chosen as a matter of design convenience. It would be possible in some embodiments of the invention to eliminate resistor R3 and diode D3, although circuit stability and ease of circuit design would suffer.

Referring back to FIG. 4, it should be noted that the sense level value is plotted against temperature. Both the high base and low base curves increase with an increase in temperature, but that they do not increase at the same rate. In other words, the high base and low base curves converge with an increase in temperature. More particularly, the high base curve is one $\Phi$ below $V_{cc}$ due to the $V_{BE}$ voltage drop across Q64. The low base curve is two $\Phi$ below the $V_{cc}$ level as a result of not only the $V_{BE}$ voltage drop across Q64, but also the $V_{BE}$ equivalent drop across either D34 or D36 (depending upon the state of the cell). Further, as the temperature increases, the $V_{BE}$ voltage drop decreases. Accordingly, as the temperature increases the high and low base voltage levels increase. The low base voltage level increases more rapidly with increasing temperature because the voltage drop is decreasing at twice the rate (two $V_{BE}$ drops). Hence, the two voltage curves converge. However, the sense level of $\Phi/2$, in the preferred embodiment, below the high base curve remains essentially constant, thereby resulting in accurate sensing of stored data independent of temperature.

The present invention is a new and improved sense amplifier circuit for read/write control of solid state memory devices. It should be appreciated that although a particular type of memory arrangement was shown in FIG. 1, such arrangement was provided for illustration and example only. The present invention may be included in any type of solid state memory providing a read and a write mode. Because the present invention will find application in many different memory devices, the scope of the present invention should be limited only by the breadth of the claims.

I claim:

1. A memory circuit having a circuit supply voltage and a circuit ground, the circuit comprising:
   a memory cell; and
   a sense amplifier circuit for read/write control of the memory cell, the sense amplifier circuit comprising:
   a reference current source;
   a write enable transistor providing a data write path and including an emitter terminal connected to said current source, a base terminal providing a write enable select, and a collector terminal;
   first and second data select transistors within said write path and including respective first and second emitter terminals connected to the collector of said write enable transistor;
   said first data select transistor having a base terminal wherein data indicating a first logic level may be selected and having a collector terminal;
   said second data select transistor having a base terminal wherein data indicating a second logic level may be selected and having a collector terminal;
   a first output transistor having a base terminal connected to the collector terminal of said first data select transistor and having an emitter terminal forming a first circuit output;
   a second output transistor having a base terminal connected to the collector terminal of said second data select transistor having an emitter terminal forming a second circuit output; and
   a sense enable transistor providing a data sense path and including an emitter terminal connected to said current source, a base terminal providing a sense enable select; and a collector terminal coupled to said first and second output transistors;
   said reference current source comprising:
   a first current source transistor having a collector terminal providing a current source output, a base terminal connected to a first reference voltage source, and an emitter terminal; and
   a reference level resistor connected between the emitter of said first current source transistor and the circuit ground;
   said first reference voltage source comprising:
   a second reference voltage node;
   a first resistor having one terminal connected to the second reference voltage node;
   a reference diode having an anode connected to another terminal of said first resistor and the base of said first current source transistor and having a cathode;
   a voltage source transistor having a collector connected to the cathode of said reference diode, having an emitter connected to the circuit ground, and having a base;
   a second resistor connected between the collector and the base of the voltage source transistor; and
   a second reference voltage source coupled to the second reference voltage node, the second reference voltage source providing a voltage which is independent of the circuit supply voltage.

2. A memory circuit according to claim 1, wherein the memory cell includes a clamping diode connected to limit the difference between a logic one-level voltage and a zero-level voltage, and wherein the first resistor and the second reference voltage source generate in the reference diode a current density substantially equal to the current density in the clamping diode when the clamping diode is forward biased.

3. The memory circuit of claim 1, further comprising:
   a first voltage dropping resistor connected between the circuit voltage source and the collector of the first data select transistor;
   a second voltage dropping resistor connected between said circuit voltage source and the collector of the second data select transistor;
   a first diode having an anode terminal connected to the collector of the first data select transistor and having a cathode terminal connected to the collector of the sense enable transistor; and
   a second diode having an anode terminal connected to the collector of the second data select transistor and having a cathode terminal connected to the collector of the sense enable transistor.

4. The memory circuit of claim 3, further comprising:
   a third voltage dropping resistor having a first terminal connected to said circuit voltage source; and
   a third diode having an anode connected to a second terminal of said third resistor and having a cathode connected to the collector of said sense enable transistor.

5. A semiconductor memory having first and second supply voltages, the memory comprising:
   a memory cell (20) for storing data as one of a set of two data voltage levels constrained to a predetermined range by a voltage limiting device (D34 or D36), the voltage limiting device, when active, limiting one of the data voltage levels to a voltage which depends in part on the temperature and in part on the density of current passing through the voltage limiting device;
   sense level voltage generating means for establishing a sense voltage between the two data voltage levels, the sense level voltage generating means including a current source (Q6, R4) having a current output and further including a current-to-voltage converter (D1, D2, D3, R1, R2, R3) having a current input coupled to the current output of the current source for establishing the sense voltage; and
   means for comparing the sense voltage with the data voltage level stored in the memory cell;
   wherein the current source comprises:
   a current source transistor (Q6) having a collector terminal providing the current output of the current source;

a current source resistor (R4) coupled between the emitter of the current source transistor and the second supply voltage;

a reference voltage source (VDCS);

a current limiting resistor (R5) coupled between the reference voltage source and the base of the current source transistor;

a voltage matching device (D4) and an additional voltage setting device (R6, Q8) series coupled between the base of the current source transistor and the second supply voltage, the voltage matching device having first and second terminals and providing across its first and second terminals a voltage having a temperature and current density dependence which matches that of the voltage limiting device in the memory cell, the additional voltage setting device maintaining the base of the current source transistor at a given voltage, the given voltage differing from the second supply voltage by an amount which is approximately equal to the voltage across the first and second terminals of the voltage matching device plus the base-to-emitter voltage drop of the current source transistor;

wherein the reference voltage source provides a voltage which is independent of the first supply voltage and which, in combination with the current limiting resistor, provides in the voltage matching device a current density substantially equal to the current density passing through the voltage limiting device when the voltage limiting device is active.

6. A memory according to claim 5, further comprising a current loss device (Q5) coupled between the current source and the current-to-voltage converter, the current loss device creating an undesirable reduction in current between the current output of the current source and the current input of the current-to-voltage converter, wherein the additional voltage setting device comprises:

a voltage setting transistor (Q8); and a base resistor (R6) coupled between the collector and base of the voltage setting transistor, the base resistor permitting sufficient current to enter the base of the voltage setting transistor so as to maintain the voltage across the collector and emitter of the voltage setting transistor at a level sufficiently large to raise the current output of the current source by an amount which compensates for the reduction in current created by the current loss device.

* * * * *